US010256439B2

(12) United States Patent
Lee et al.

(10) Patent No.: US 10,256,439 B2
(45) Date of Patent: Apr. 9, 2019

(54) TANDEM ORGANIC LIGHT-EMITTING ELEMENT

(71) Applicants: Corning Precision Materials Co., Ltd., Chungcheongnam-do (KR); UNIVERSITY-INDUSTRY COOPERATION GROUP OF KYUNG HEE UNIVERSITY, Gyeonggi-do (KR)

(72) Inventors: Hyung Seok Lee, Chungcheongnam-do (KR); Kwang Je Woo, Chungcheongnam-do (KR); Jang Dae Youn, Chungcheongnam-do (KR); Jang Hyuk Kwon, Chungcheongnam-do (KR); Young Hoon Son, Chungcheongnam-do (KR)

(73) Assignees: Corning Precision Materials Co., Ltd. (KR); University-Industry Cooperation Group of Kyung Hee University (KR)

( * ) Notice: Subject to any disclaimer, the term of this patent is extended or adjusted under 35 U.S.C. 154(b) by 56 days.

(21) Appl. No.: 15/541,654

(22) PCT Filed: Jan. 5, 2016

(86) PCT No.: PCT/KR2016/000074
§ 371 (c)(1),
(2) Date: Jul. 5, 2017

(87) PCT Pub. No.: WO2016/111535
PCT Pub. Date: Jul. 14, 2016

(65) Prior Publication Data
US 2017/0331075 A1 Nov. 16, 2017

(30) Foreign Application Priority Data

Jan. 5, 2015 (KR) .................. 10-2015-0000398
May 22, 2015 (KR) .................. 10-2015-0071977

(51) Int. Cl.
H01L 51/52 (2006.01)
H01L 51/00 (2006.01)
H01L 51/50 (2006.01)

(52) U.S. Cl.
CPC ...... *H01L 51/5278* (2013.01); *H01L 51/0072* (2013.01); *H01L 51/0097* (2013.01);
(Continued)

(58) Field of Classification Search
CPC . H01L 51/52; H01L 51/5278; H01L 51/0072; H01L 51/0097; H01L 51/5206
See application file for complete search history.

(56) References Cited

U.S. PATENT DOCUMENTS 8,294,359 B2* 10/2012 Ben Khalifa ......... H01L 51/002
313/504
9,673,414 B2* 6/2017 Bai ....................... H01L 51/508
(Continued)

FOREIGN PATENT DOCUMENTS

JP          4649676 B      12/2010
KR     20110035048 A       4/2011
(Continued)

OTHER PUBLICATIONS

International Search Report for Appln No. PCT/KR2016/000074 dated Apr. 15, 2016.

*Primary Examiner* — Phuc Dang
(74) *Attorney, Agent, or Firm* — Lerner, David, Littenberg, Krumholz & Mentlik, LLP

(57) ABSTRACT

The present invention relates to a tandem organic light-emitting element, more particularly to a tandem organic light-emitting element which may decrease a driving voltage in a driving region of a charge generation layer by sequentially laminating an electronics layer, which is doped with a metal dopant, and an electronics layer, which is doped with (Continued)

an organic dopant, on one side of the charge generation layer, thereby having increased power efficiency and life span. To this end, the present invention provides a tandem organic light-emitting element which is characterized by comprising: a base substrate; a first electrode formed on the base substrate; a second electrode formed opposite to the first electrode; two or more organic light-emitting layers, formed between the first electrode and the second electrode, comprising a light-emitting layer, a hole transfer layer formed between the light-emitting layer and the first electrode, and an electronics layer formed between the light-emitting layer and the second electrode; and a charge generation layer formed between the neighboring organic light-emitting layers, wherein the electronics layer formed between the light-emitting layer and the charge generation layer has a multilayer structure, while comprising a first electronics layer doped with a metal dopant and a second electronics layer doped with an organic dopant.

9 Claims, 4 Drawing Sheets

(52) U.S. Cl.
CPC ...... *H01L 51/5206* (2013.01); *H01L 51/5221* (2013.01); *H01L 51/5052* (2013.01); *H01L 51/5076* (2013.01); *H01L 2251/5338* (2013.01)

(56) References Cited

U.S. PATENT DOCUMENTS

| | | | |
|---|---|---|---|
| 2008/0118775 A1* | 5/2008 | Kim | B82Y 10/00 428/690 |
| 2011/0073844 A1 | 3/2011 | Pieh et al. | |
| 2012/0074395 A1 | 3/2012 | Yabunouchi et al. | |
| 2012/0161165 A1* | 6/2012 | Yamazaki | H01L 27/3202 257/88 |
| 2013/0285022 A1* | 10/2013 | Su | H01L 51/5092 257/40 |
| 2013/0313527 A1 | 11/2013 | Kim | |
| 2015/0069357 A1* | 3/2015 | Park | H01L 51/508 257/40 |
| 2015/0076451 A1* | 3/2015 | Dobbertin | H01L 51/504 257/40 |
| 2015/0076452 A1* | 3/2015 | Setz | H01L 51/5262 257/40 |
| 2015/0144897 A1 | 5/2015 | Kang et al. | |
| 2016/0005990 A1* | 1/2016 | Lee | H01L 51/5036 257/40 |

FOREIGN PATENT DOCUMENTS

| | | |
|---|---|---|
| KR | 20120022859 A | 3/2012 |
| KR | 20130130550 A | 12/2013 |
| KR | 20130135161 A | 12/2013 |
| WO | 2014185075 A1 | 11/2014 |

* cited by examiner

TANDEM ORGANIC LIGHT-EMITTING ELEMENT

CROSS-REFERENCE TO RELATED APPLICATION

This application is a national phase entry under 35 U.S.C. § 371 of International Application No. PCT/KR2016/000074, filed Jan. 5, 2016, published in Korean, which claims priority to Korean Patent Application No. 10-2015-0000398, filed on Jan. 5, 2015, and Korean Patent Application No. 10-2015-0071977, filed on May 22, 2015; the disclosures of which are incorporated herein by reference.

TECHNICAL FIELD

The present disclosure relates to a tandem organic light-emitting device (OLED). More specifically, the present disclosure relates to a tandem OLED having improved power efficiency and an increased lifespan, in which an electron layer doped with a metal dopant and an electron layer doped with an organic dopant are sequentially layered on one side of a charge generation layer (CGL) to reduce a driving voltage in a CGL driving area.

BACKGROUND ART

Recently, display devices and lighting devices have been required to be, for example, lightweight, thin, highly efficient, and eco-friendly. To satisfy these requirements, studies into the use of organic light-emitting devices (OLEDs) have been actively undertaken.

OLEDs may be divided into single OLEDs, each of which has a single organic light-emitting layer, and tandem OLEDs, each of which has two or more organic light-emitting layers stacked on each other in series. Tandem OLEDs may be used in display devices or lighting devices requiring a high level of luminance and a longer lifespan due to higher reliability and longer lifespans thereof, as compared to single OLEDs.

A white OLED has different organic light-emitting layers between an anode and a cathode, to emit different colors of light. A charge generation layer is disposed between the organic light-emitting layers.

However, conventional charge generation layers lower and reduce the power efficiencies and lifespans of OLEDs due to high driving voltages thereof, which may be problematic.

RELATED ART DOCUMENT

Japanese Patent No. 4649676 (Dec. 24, 2010)

DISCLOSURE

Technical Problem

Accordingly, the present disclosure has been made in consideration of the above-described problems occurring in the related art, and the present disclosure proposes a tandem organic light-emitting device (OLED) having improved power efficiency and an improved lifespan.

Technical Solution

According to an aspect of the present disclosure, a tandem organic light-emitting device (OLED) may include: a base substrate; a first electrode disposed on the base substrate; a second electrode facing the first electrode; two or more organic light-emitting layers disposed between the first electrode and the second electrode, the two or more organic light-emitting layers respectively including an emissive layer, a hole layer disposed between the emissive layer and the first electrode, and an electron layer disposed between the emissive layer and the second electrode; and one or more charge generation layers respectively disposed between adjacent organic light-emitting layers among the two or more organic light-emitting layers. The electron layer disposed between the emissive layer and a corresponding charge generation layer of the one or more charge generation layers has a multilayer structure and includes a first electron layer doped with a metal dopant and a second electron layer doped with an organic dopant.

The first electron layer and the second electron layer may be sequentially disposed on the corresponding charge generation layer between the emissive layer and the corresponding charge generation layer.

The first electron layer and the second electron layer may be n-type electron layers.

The electron layer may further include a third electron layer disposed between the second electron layer and the emissive layer.

The hole layer may have a multilayer structure comprised of a first hole layer and a second hole layer sequentially disposed on the emissive layer.

The second hole layer may be a p-type hole layer.

The one or more charge generation layers may be formed from hexacyano hexaazatriphenylene (HATCN).

The two or more organic light-emitting layers may include a first organic light-emitting layer disposed on the first electrode, a second organic light-emitting layer disposed on the first organic light-emitting layer, and a third organic light-emitting layer disposed on the second organic light-emitting layer. The one or more charge generation layers may include a first charge generation layer disposed between the first organic light-emitting layer and the second organic light-emitting layer and a second charge generation layer disposed between the second organic light-emitting layer and the third organic light-emitting layer.

A total thickness of the first to third organic light-emitting layers and the first and second charge generation layers may be about 500 nm or less.

The emissive layer of the first organic light-emitting layer may generate blue light, the emissive layer of the second organic light-emitting layer may generate yellow light, and the emissive layer of the third organic light-emitting layer may generate red light.

The base substrate may be a flexible substrate.

The base substrate may be a thin glass sheet having a thickness of about 1.5 mm or less.

Advantageous Effects

As set forth above, the electron layer doped with a metal dopant and the electron layer doped with an organic dopant, sequentially layered on one side of the charge generation layer, can reduce a driving voltage in a charge generation layer, thereby improving power efficiency and increasing a lifespan of a tandem OLED.

BEST MODE

Hereinafter, a tandem organic light-emitting device (OLED) of an exemplary embodiment will be described in detail with reference to the accompanying drawings.

In the following disclosure, detailed descriptions of known functions and components incorporated herein will be omitted in the case that the subject matter of the present disclosure may be rendered unclear by the inclusion thereof.

Figure 1:
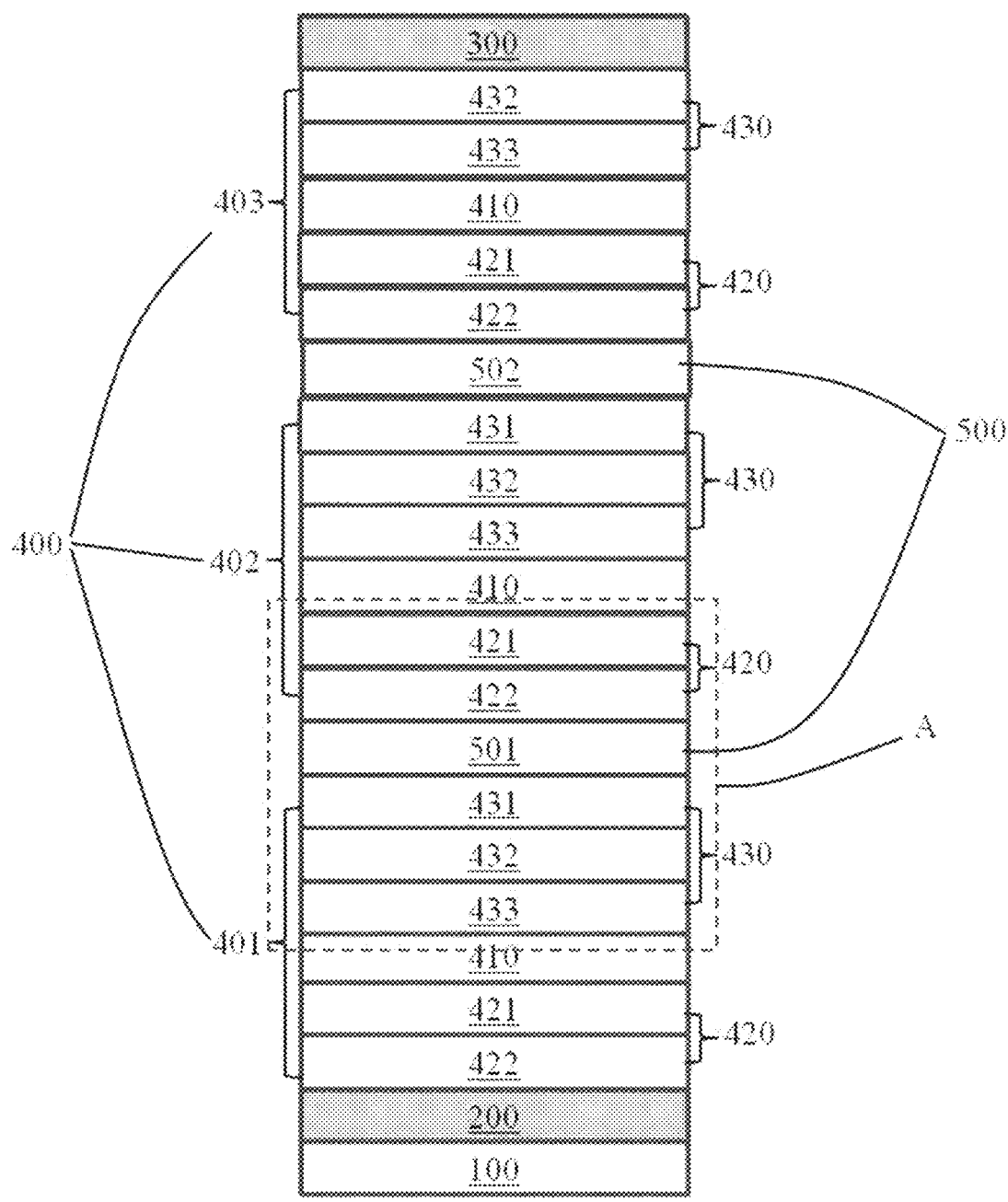
FIG. 1 is a schematic cross-sectional view illustrating a tandem OLED according to an exemplary embodiment.

As illustrated in FIG. 1, a tandem OLED 10 according to an exemplary embodiment includes a base substrate 100, a first electrode 200, a second electrode 300, organic light-emitting layers 400, and charge generation layers (CGLs) 500.

The base substrate 100 serves as a light guide through which light generated by the organic light-emitting layers 400 exits. In this regard, the base substrate 100 is disposed in front of the organic light-emitting layers 400, i.e. in the direction in which light generated by the organic light-emitting layers 400 exits. In addition, the base substrate 100 serves to protect the first electrode 200, the second electrode 300, the organic light-emitting layers 400, and the CGLs 500 from the external environment. In this regard, to encapsulate the first electrode 200, the second electrode 300, the organic light-emitting layers 400, and the CGLs 500, the base substrate 100 is bonded to a rear substrate (not shown) disposed above the second electrode 300 to face the base substrate 110, by means of a sealing material, such as epoxy, formed along the outer circumferential surface of the base substrate 100. In the inner space defined by the base substrate 100, the rear substrate (not shown) facing the base substrate 100, and the sealing material, a portion of the inner space, except for a portion of the inner space occupied by the first electrode 200, the second electrode 300, the organic light-emitting layers 140, and the CGLs 500, may be filled with an inert gas or may be formed to have a vacuum atmosphere.

On the other hand, to improve external extraction efficiency of light generated by the organic light-emitting layers 400, a separate external light extraction layer (not shown) may be disposed on the outer surface of the base substrate 100 that contacts the ambient air or the base substrate 100 may have a lens array in the outer surface thereof. In addition, an internal light extraction layer (not shown) may be formed between the base substrate 100 and the first electrode 200.

The base substrate 100 may be a transparent substrate formed from any transparent material having superior light transmittance and excellent mechanical properties. For example, the base substrate 100 may be formed from a polymeric material, such as a thermally or ultraviolet (UV) curable organic film. In addition, the base substrate 100 may be formed from chemically strengthened glass, such as soda-lime glass ($SiO_2$—CaO—$Na_2O$) or aluminosilicate glass ($SiO_2$—$Al_2O_3$—$Na_2O$). When the tandem OLED 10 according to the exemplary embodiment is used for lighting, the base substrate 100 may be formed from soda-lime glass. In addition, the base substrate 100 may be a metal oxide substrate or a metal nitride substrate. The base substrate 100 according to the exemplary embodiment may be a flexible substrate, in particular, a thin glass sheet having a thickness of about 1.5 mm or less. The thin glass substrate may be fabricated using a fusion process or a floating process. The rear substrate (not shown) forming an encapsulation portion with the base substrate 100 may be formed from the same material as or a different material from the base substrate 100.

The first electrode 200 is formed on the base substrate 100. The first electrode 200 is a transparent electrode acting as an anode of the tandem OLED 10. The first electrode 200 may be formed from a material selected from among materials having a greater work function to facilitate hole injection into the organic light-emitting layers 400, the selected material being able to enhance the transmission of light generated by the organic light-emitting layers 400. For example, the first electrode 200 may be formed from indium tin oxide (ITO).

The second electrode 300 is disposed to face the first electrode 200, such that the organic light-emitting layers 400 and the CGLs 500 are situated between the second electrode 300 and the first electrode 200. The second electrode 300 is a metal electrode acting as a cathode of the tandem OLED 10. The second electrode 300 may be formed from a material selected from among materials reflecting light generated by the organic light-emitting layers 400 forwardly, i.e. in the direction of the base substrate 100, the selected material having a smaller work function to improve electron injection into the organic light-emitting layers 400. For example, the second electrode 300 may be a metal thin film formed from Al, Al:Li or Mg:Ag.

Two or more organic light-emitting layers 400 are situated between the first electrode 200 and the second electrode 300 to form the tandem OLED 10. The organic light-emitting layers 400 according to the exemplary embodiment includes a first organic light-emitting layer 401 disposed on the first electrode 200, a second organic light-emitting layer 402 disposed on the first organic light-emitting layer 401, and a third organic light-emitting layer 403 disposed on the second light-emitting emissive layer 402. The CGLs 500 are situated between the first and second organic light-emitting layers 401 and 402 and between the second and third organic light-emitting layers 402 and 403. However, this is merely an example, and the organic light-emitting layers 400 may only include the first organic light-emitting layer 401 and the second organic light-emitting layer 402 or may include at least four organic light-emitting layers. Each of the organic light-emitting layers 400, i.e. each of the first to third organic light-emitting layers 401 to 403, includes an emissive layer (EML) 410, a hole layer 420, and an electron layer 430. The hole layer 420 is formed between the emissive layer 410 and the first electrode 200. The electron layer 430 is formed between the emissive layer 410 and the second electrode 300.

According to the exemplary embodiment, the emissive layer 410 of the first organic light-emitting layer 401 may be formed from a material emitting blue light having a wavelength bandwidth of about 450±5 nm. In addition, the emissive layer 410 of the second organic light-emitting layer 402 may be formed from a material emitting yellow light having a wavelength bandwidth of about 540±5 nm. The emissive layer 410 of the third organic light-emitting layer 403 may be formed from a material emitting red light having a wavelength bandwidth of about 610±5 nm. Due to a light mixing effect of blue, yellow, and red light respectively emitted from the first to third organic light-emitting layers 401 to 403, as described above, the tandem OLED 10 according to the exemplary embodiment emits white light. However, this is merely an example, and each emissive layer 410 may be formed in various structures and various shapes and may be formed from various materials to generate white light.

According to the exemplary embodiment, the hole layer 420 may have a multilayer structure. Specifically, the hole layer 420 includes a first hole layer 421 and a second hole layer 422, sequentially disposed on the emissive layer 410. The second hole layer 422 may be a p-type hole layer. The first hole layer 421 and the second hole layer 422 constitute a hole transport layer (HTL, not shown), situated between the hole layer 420 and the first electrode 200 or between the hole layer 420 and the CGL 500. Therefore, in the first organic light-emitting layer 401, holes migrate from the first electrode 200 to the emissive layer 410 through the hole injection layer (not shown), the second hole layer 422, and the first hole layer 421. On the other hand, in the second and third organic light-emitting layers 402 and 403, holes migrate from the CGL 500 to the emissive layer 410 through the hole injection layer (not shown), the second hole layer 422, and the first hole layer 421.

According to the exemplary embodiment, like the hole layer 420, the electron layer 430 may have a multilayer structure. That is, the electron layer 430 having a multilayer structure is situated between the emissive layer 410 and the second electrode 300. In particular, the electron layer 430, situated between the emissive layer 410 and the CGL 500, includes a first electron layer 431 and a second electron layer 432, sequentially disposed on the CGL 500. According to the exemplary embodiment, the first electron layer 431 is an electron layer doped with a metal dopant including a nanoparticle of an alkali metal, such as Li, Cs, Rb, Ca, Mg, or Ag. The second electron layer 432 is an electron layer doped with an organic dopant. Both the first electron layer 431 and the second electron layer 432 are n-type electron layers. In this case, an n-type organic dopant collectively refers to a pure organic compound or an organometallic complex. For example, when the n-type organic dopant includes an organometallic complex, the n-type organic dopant may be a carbonate-based organic material, such as $CsCO_3$, $Rb_2CO_3$, $Li_2CO_3$, $Ca_2CO_3$, $Na_2CO_3$, $K_2CO_3$, $MgCO_3$, or $BaCO_3$, or an azide-based organic material, such as $CsN_3$, $LiN_3$, or $NaN_3$.

Therefore, the p-type hole layer is disposed on a surface side of the charge generation layer 500 and the n-type electron layer is disposed on the other surface of the CGL 500 to constitute a PIN structure. As described above, when the first electron layer 431 doped with the metal dopant and the second electron layer 432 doped with the organic dopant are sequentially disposed on the other surface of the CGL 500, the CGL 500 can have both the initial injection properties of the metal dopant and the carrier transfer capability of the organic dopant to significantly lower resistance in the driving area of the CGL 500 and reduce a driving voltage, thereby achieving improved power efficiency and increased lifespan of the tandem OLED 10.

In addition, the electron layer 430 may further include a third electron layer 433 formed between the second electron layer 432 and the emissive layer 410. Here, the first electron layer 431, the second electron layer 432, and the third electron layer 430 constitute an electron transport layer (ETL). An electron injection layer (EIL) (not shown) may be situated between the electron layer 430 and the CGL 500 or between the electron layer 430 and the second electrode 300. Therefore, in each of the first and second organic light-emitting layers 401 and 402, electrons migrate from the CGL 500 to the emissive layer 410 through the electron injection layer (not shown), the first electron layer 431, the second electron layer 432, and the third electron layer 433. On the other hand, in the third organic light-emitting layer 403, since the electron layer 430 includes the second electron layer 432 and the third electron layer 433, electrons migrate from the second electrode 300 to the emissive layer 410 through the electron injection layer (not shown), the second electron layer 432, and the third electron layer 433.

That is, in the first organic light-emitting layer 401, holes migrate from the first electrode 200 to the emissive layer 410, while electrons migrate from the CGL 500, more specifically, the first CGL 501, to the emissive layer 410. In addition, in the second organic light-emitting layer 402, holes migrate from the first charge generation layer 501 to the emissive layer 410, while electrons migrate from the second CGL 502 to the emissive layer 410. In the third organic light-emitting layer 403, holes migrate from the second CGL 502 to the emissive layer 410, while electrons migrate from the second electrode 300 to the emissive layer 410.

When a forward voltage is applied to the first electrode 200 and the second electrode 300, electrons and holes migrate to the emissive layer 410 through the routes described above, respectively. Electrons and holes injected into the emissive layer 410, as above, recombine with each other to generate excitons. When these excitons transit from an excited state to a ground state, light is emitted. The brightness of emitted light is proportional to the amount of current flowing between the first electrode 200 acting as an anode and the second electrode 300 acting as a cathode.

The CGLs 500 are respectively situated between adjacent organic light-emitting layers among the organic light-emitting layers 400. The CGL 500 according to the exemplary embodiment may be formed from hexacyano hexaazatriphenylene (HATCN). The CGL 500 acts as an interconnecting layer to adjust a charge balance between neighboring or adjacent organic light-emitting layers 400. As described above, since the organic light-emitting layers 400 according to the exemplary embodiment have a multilayer structure comprised of the first organic light-emitting layer 401, the second organic light-emitting layer 402, and the third organic light-emitting layer 403, the CGLs 500 include the first CGL 501 situated between the first organic light-emitting layer 401 and the second organic light-emitting layer 402 and the second CGL 502 situated between the second organic light-emitting layer 402 and the third organic light-emitting layer 403. As the first electron layer 431 doped with the metal dopant and the second electron layer 432 doped with the organic dopant are sequentially disposed on one side of each of the first CGL 501 and the second CGL 502, the first CGL 501 and the second CGL 502 have both the initial injection properties and carrier transfer capability of the organic dopant. That is, due to the metal dopant and the organic dopant, a resistance and a driving voltage may be reduced in the driving areas of the first CGL 501 and the second CGL 502, thereby achieving improved power efficiency and increased lifespan of the tandem OLED 10 according to the exemplary embodiment.

In the tandem OLED 10 according to the exemplary embodiment, the total thickness of the first organic light-emitting layer 401, the second organic light-emitting layer 402, and the third organic light-emitting layer 403, the first CGL 501, and the second CGL 502 may be controlled to be about 500 nm or less. In this case, the distance between the emissive layer 410 of the first organic light-emitting layer 401 and the second electrode 300 may be about 292 nm. The distance between the emissive layer 410 of the second organic light-emitting layer 402 and the second electrode 300 may be about 200 nm. The distance between the emissive layer 410 of the third organic light-emitting layer 403 and the second electrode 300 may be about 60 nm. In addition, the distance between the emissive layer 410 of the first organic light-emitting layer 401 and the first electrode 200 may be about 95 nm.

Figure 2:
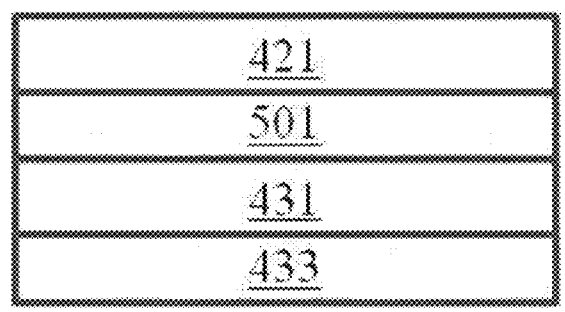
FIG. 2 is a schematic cross-sectional view illustrating a structure of Comparative Example 1, corresponding to area "A" in FIG. 1.
Figure 3:
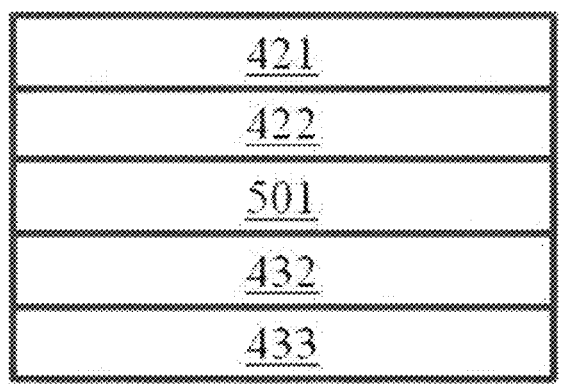
FIG. 3 is a schematic cross-sectional view illustrating a structure of Comparative Example 2, corresponding to area "A" in FIG. 1.

FIG. 2 is a schematic cross-sectional view illustrating a structure of Comparative Example 1, corresponding to area "A" in FIG. 1, while FIG. 3 is a schematic cross-sectional view illustrating a structure of Comparative Example 2, corresponding to area "A" in FIG. 1. As illustrated in FIG. 2, in comparison to area "A" according to the exemplary embodiment, according to the structure of Comparative Example 1, only the first hole layer 421 having a monolayer structure is disposed on one side of the first CGL 501, and the second electron layer 432 doped with the organic dopant is omitted from the other side of the first CGL 501. In addition, according to the structure of Comparative Example 2, the first electron layer 431, doped with the metal dopant, is omitted. While the exemplary embodiment includes both the first electron layer 431 doped with the metal dopant and the second electron layer 432 doped with the organic dopant, Comparative Example 1 includes only the first electron layer 431 and Comparative Example 2 includes only the second electron layer 432.

TABLE 1

| Integration sphere @ 3,000 nits | Comparative Example 1 | Comparative Example 2 | Inventive Example |
|---|---|---|---|
| Driving voltage (V) | 8.3 | 8.2 | 7.7 |
| Power efficiency (lm/W) | 41.3 | 44.3 | 47.0 |

Figure 4:
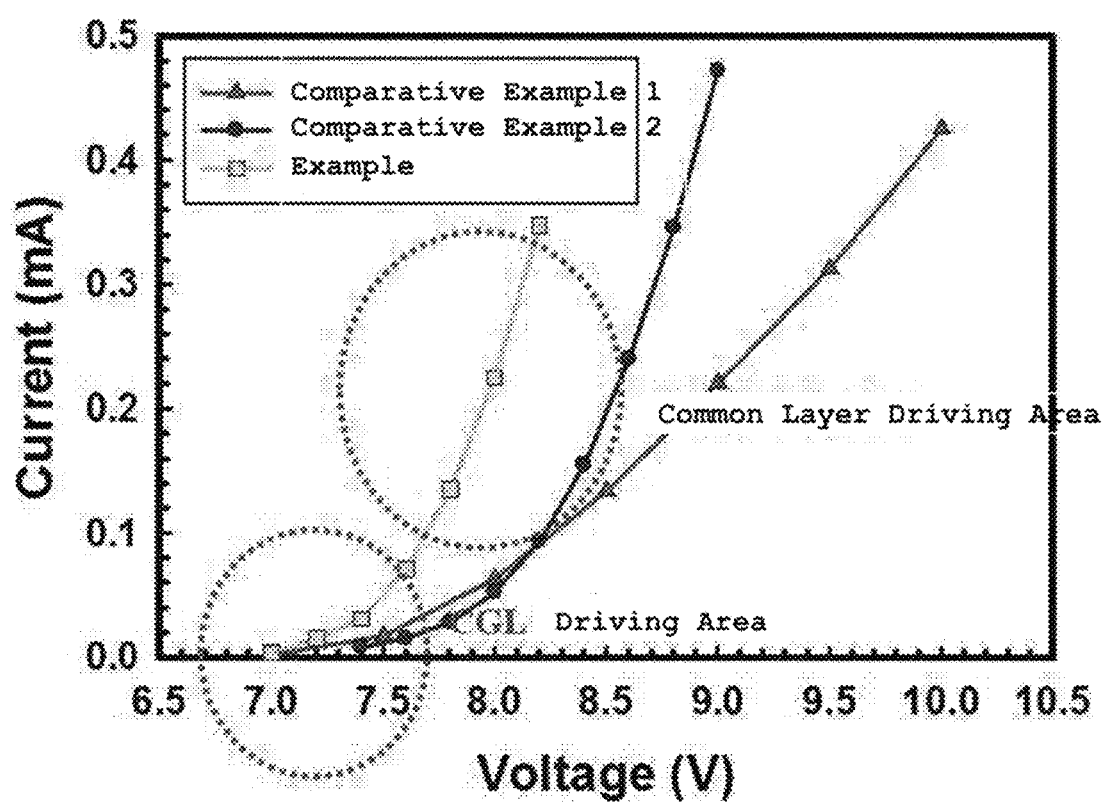
FIG. 4 is a graph illustrating current changes according to driving voltages in the Inventive Example and Comparative Examples 1 and 2.
Figure 5:
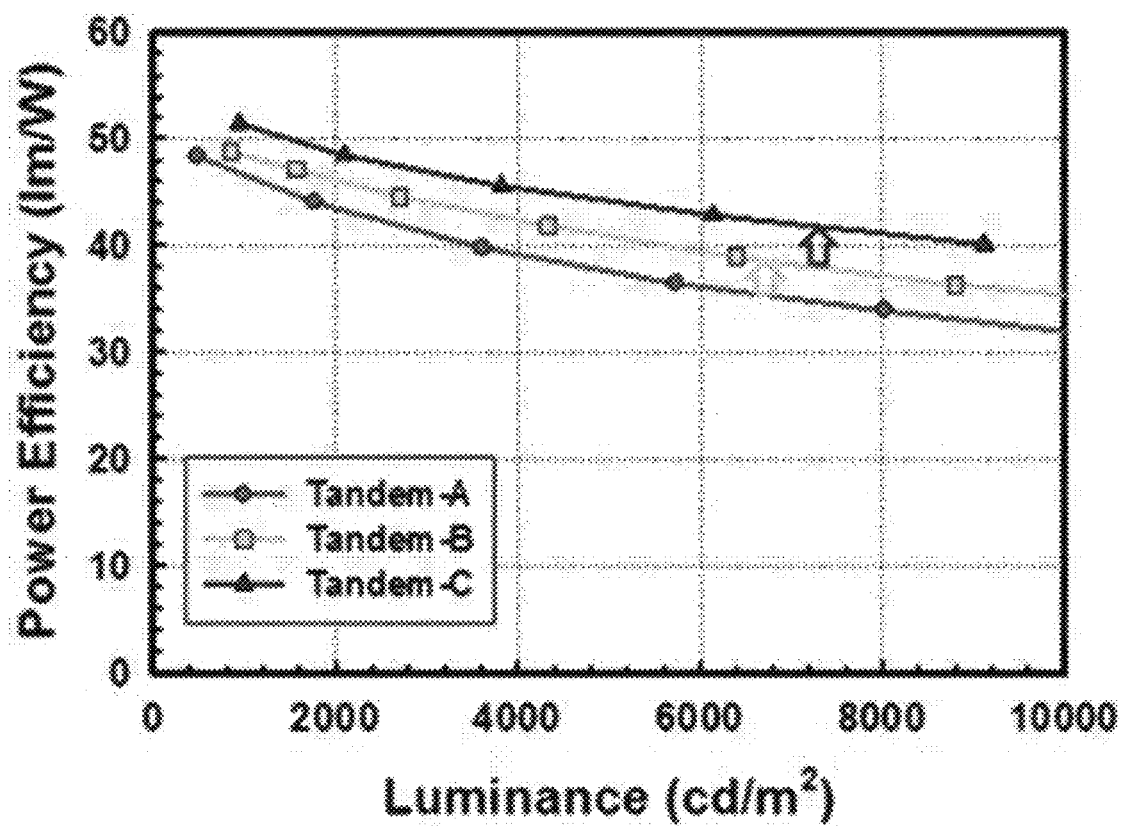
FIG. 5 is a graph illustrating power efficiencies of the Inventive Example and Comparative Examples 1 and 2.

FIG. 4 is a graph illustrating current changes according to driving voltages in the Inventive Example and Comparative Examples 1 and 2, while FIG. 5 is a graph illustrating power efficiencies of the Inventive Example and Comparative Examples 1 and 2. The power efficiencies of Inventive Example and Comparative Examples 1 and 2 are compared in Table 1.

Referring to the graph in FIG. 4, it can be appreciated that a resistance in a CGL driving area in the Inventive Example is significantly reduced, as compared to Comparative Examples 1 and 2. According to the Inventive Example, it is possible to significantly reduce a turn-on voltage and a driving voltage. Such a decrease in resistance reduces a driving voltage as represented in Table 1. Thus, it is confirmed that power efficiency of the Inventive Example at 3,000 nits is 47.0 lm/W, which is significantly increased from 41.3 lm/W of Comparative Example 1 and 44.3 lm/W of Comparative Example 2. In addition, it is confirmed that the power efficiency of Inventive Example at 1,000 nits is 51 lm/W (7.4 V), which is significantly greater than 47 lm/W (7.7 V) of Comparative Example 1 and 48 lm/W (7.8 V) of Comparative Example 2.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure should not be limited to the foregoing embodiments, but shall be defined by the Claims appended hereto and their equivalents.

Description of Reference Numerals of Drawings

| | |
|---|---|
| 10: tandem OLED | 100: base substrate |
| 200: first electrode | 300: second electrode |
| 400: organic light-emitting layer | |
| 401: first organic light-emitting layer | |
| 402: second organic light-emitting layer | |
| 403: third organic light-emitting layer | |
| 410: emissive layer | 420: hole layer |
| 421: first hole layer | 422: second hole layer |
| 430: electron layer | 431: first electron layer |
| 432: second electron layer | 433: third electron layer |
| 500: electron generation layer | |
| 501: first electron generation layer | |
| 502: second electron generation layer | |

The invention claimed is:

1. A tandem organic light-emitting device comprising:
a base substrate;
a first electrode disposed on the base substrate;
a second electrode facing the first electrode;
three or more organic light-emitting layers disposed between the first electrode and the second electrode including a first organic light-emitting layer disposed on the first electrode, a second organic light-emitting layer disposed on the first organic light-emitting layer, and a third organic light-emitting layer disposed on the second organic light-emitting layer, each of the first, second and third organic light-emitting layers comprising an emissive layer, a hole layer disposed between the emissive layer and the first electrode, and an electron layer disposed between the emissive layer and the second electrode,
wherein the hole layer has a multilayer structure comprised of a first hole layer and a second hole layer sequentially disposed on the emissive layer;
a first charge generation layers disposed between the first organic light-emitting layer and the second organic light-emitting layer, and
a second charge generation layer disposed between the second organic light-emitting layer and the third organic light-emitting layer,
wherein the electron layer of each of the first, second and third organic light-emitting layers has a multilayer structure and comprises a first electron layer doped with a metal dopant and a second electron layer doped with an organic dopant,
wherein the first electron layer and the second electron layer of the first organic light-emitting layer are sequentially disposed on the first charge generation layer between the emissive layer of the first organic light-emitting layer and the first charge generation layer,
wherein the first electron layer and the second electron layer of the second organic light-emitting layer are sequentially disposed on the second charge generation layer between the emissive layer of the second organic light-emitting layer and the second charge generation layer, and wherein the first electron layer and the second electron layer of the third organic light-emitting layer are sequentially disposed on the second electrode between the emissive layer of the third organic light-emitting layer and the second electrode, and wherein a total thickness of the first to third organic light-emitting layers and the first and second charge generation layers is about 500 nm or less.

2. The tandem organic light-emitting device of claim 1, wherein the first electron layer and the second electron layer are n-type electron layers.

3. The tandem organic light-emitting device of claim 2, wherein the electron layer further comprises a third electron layer disposed between the second electron layer and the emissive layer.

4. The tandem organic light-emitting device of claim 1, wherein the second hole layer is a p-type hole layer.

5. The tandem organic light-emitting device of claim 1, wherein the one or more charge generation layers are formed from hexacyano hexaazatriphenylene (HATCN).

6. The tandem organic light-emitting device of claim 1, wherein the emissive layer of the first organic light-emitting layer generates blue light, the emissive layer of the second organic light-emitting layer generates yellow light, and the emissive layer of the third organic light-emitting layer generates red light.

7. The tandem organic light-emitting device of claim 1, wherein the base substrate is a flexible substrate.

8. The tandem organic light-emitting device of claim 7, wherein the base substrate is a thin glass sheet having a thickness of about 1.5 mm or less.

9. The tandem organic light-emitting device of claim 1, wherein the first hole layer and the second hole layer constitute a hole transport layer.

* * * * *